United States Patent [19]
Takizawa

[11] Patent Number: 6,072,331
[45] Date of Patent: Jun. 6, 2000

[54] AMPLIFIER FOR ACTIVE TERMINATOR

[75] Inventor: Noboru Takizawa, Kyoto, Japan

[73] Assignee: Rohm Co., Ltd., Kyoto, Japan

[21] Appl. No.: 08/997,291

[22] Filed: Dec. 23, 1997

[30] Foreign Application Priority Data

Mar. 18, 1997 [JP] Japan ................................. 9-084550

[51] Int. Cl.⁷ ..................... H03K 17/16; H03K 19/018
[52] U.S. Cl. ................... 326/30; 326/26; 326/90; 330/255
[58] Field of Search ................... 326/18, 30, 90, 326/26, 17, 126–127; 330/255; 327/538–539, 560–561, 379, 384–385

[56] References Cited

U.S. PATENT DOCUMENTS

| 4,555,676 | 11/1985 | Van De Plassche et al. | 330/255 |
| 5,128,631 | 7/1992 | Feliz et al. | 330/255 |
| 5,142,245 | 8/1992 | Barbu | 330/255 |
| 5,574,391 | 11/1996 | Hanibuchi et al. | 326/18 |
| 5,825,819 | 10/1998 | Cogburn | 330/255 |

*Primary Examiner*—Jon Santamauro
*Attorney, Agent, or Firm*—Majestic, Parsons, Siebert & Hsue P.C.

[57] ABSTRACT

An amplifier for an active terminator for outputting a specified voltage to a bus line through a terminal resistor includes a capacitor inserted between the drive line such as a base line of an output transistor and a voltage source such as a power voltage source or a grounding line. When there is a sudden change in the voltage condition in the bus line, the capacitor can quickly react to supply a current to the output transistor.

12 Claims, 5 Drawing Sheets

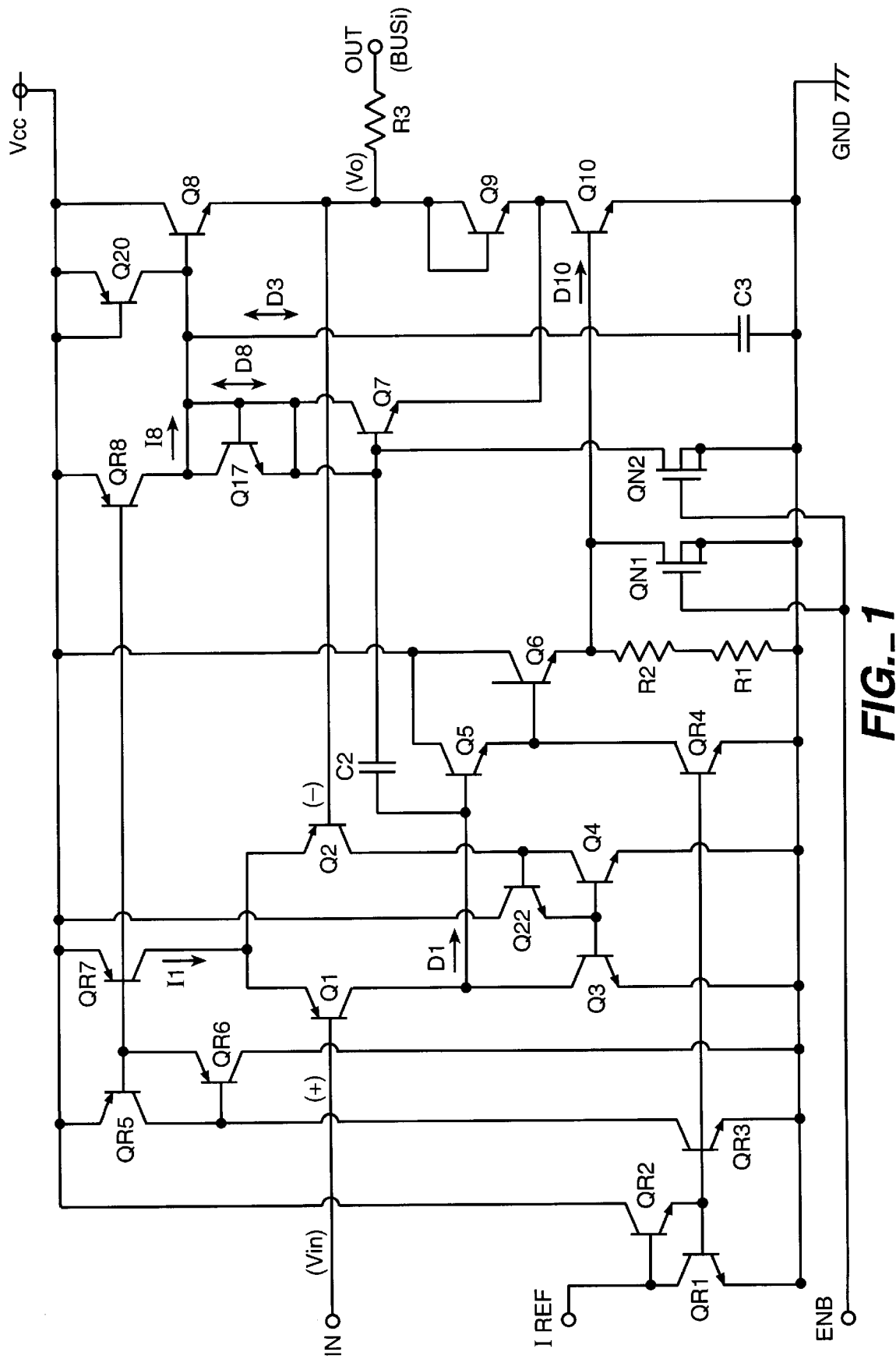
FIG._1

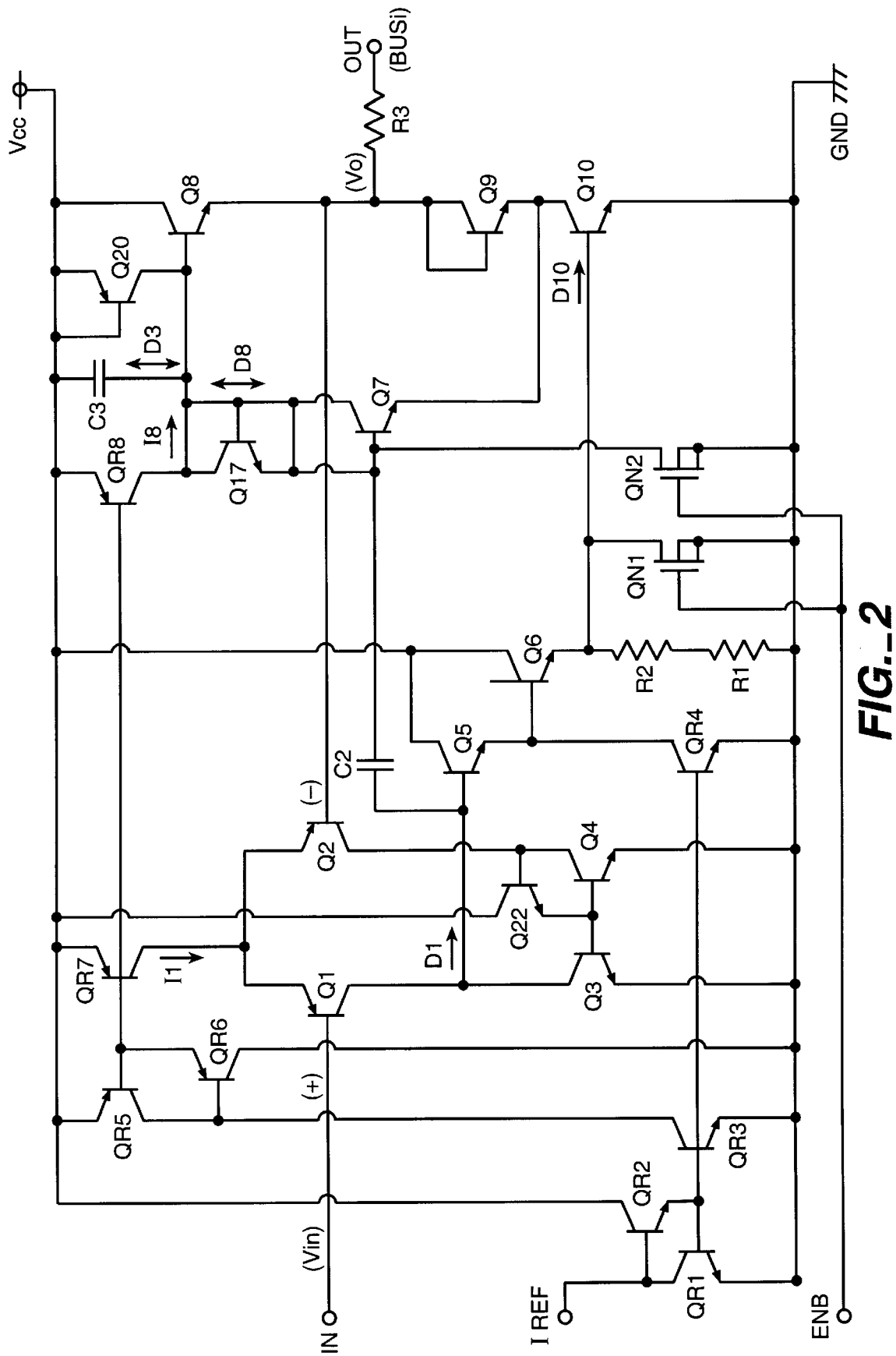
FIG._2

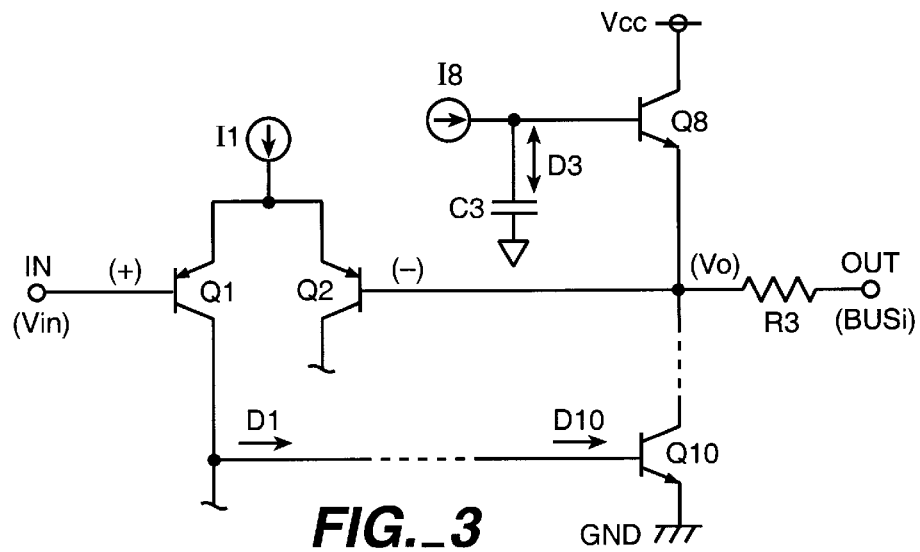
FIG._3
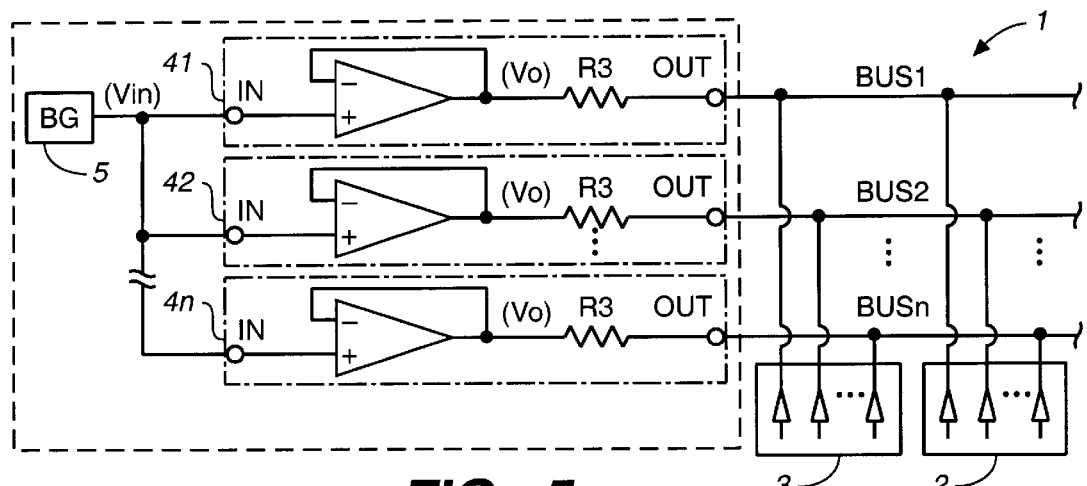
FIG._5
*(PRIOR ART)*

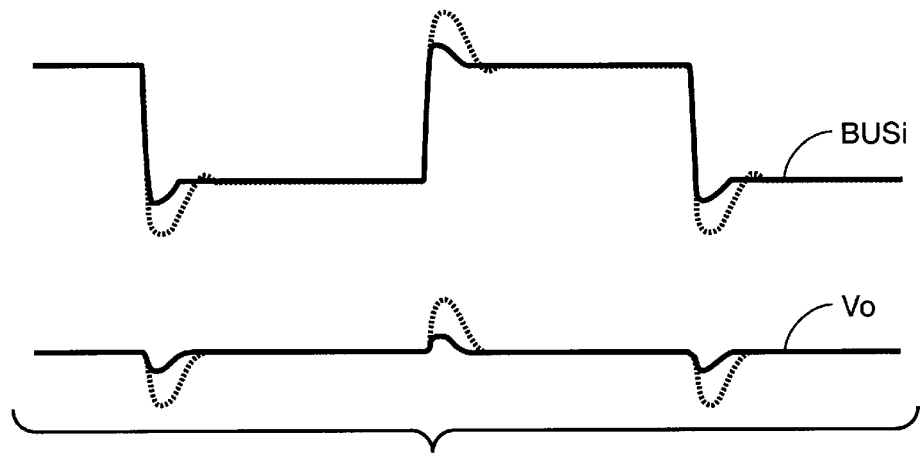
FIG._4
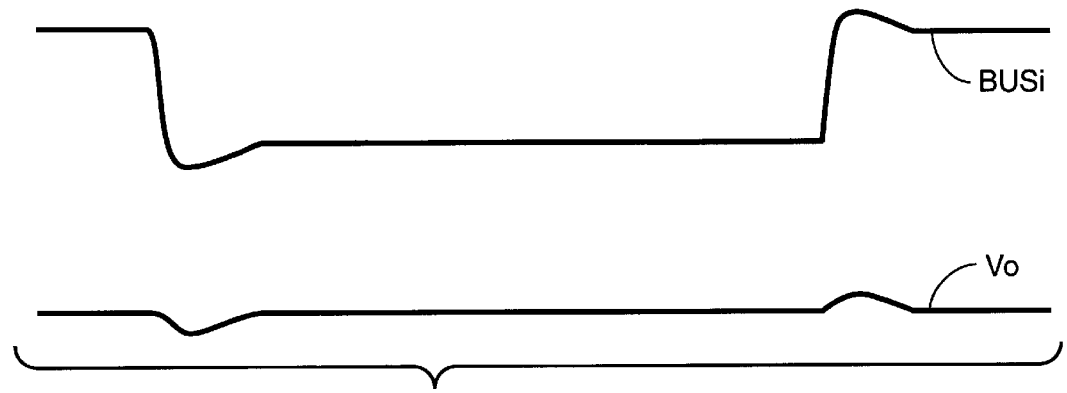
FIG._7 (PRIOR ART)
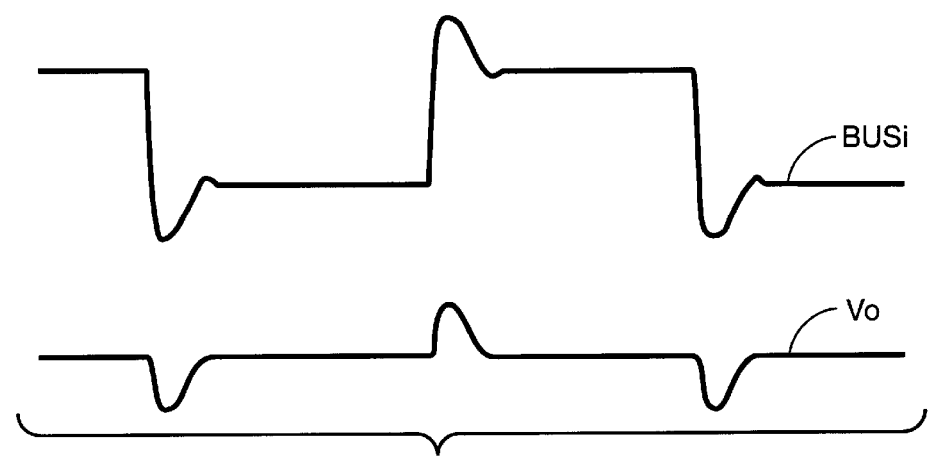
FIG._8 (PRIOR ART)

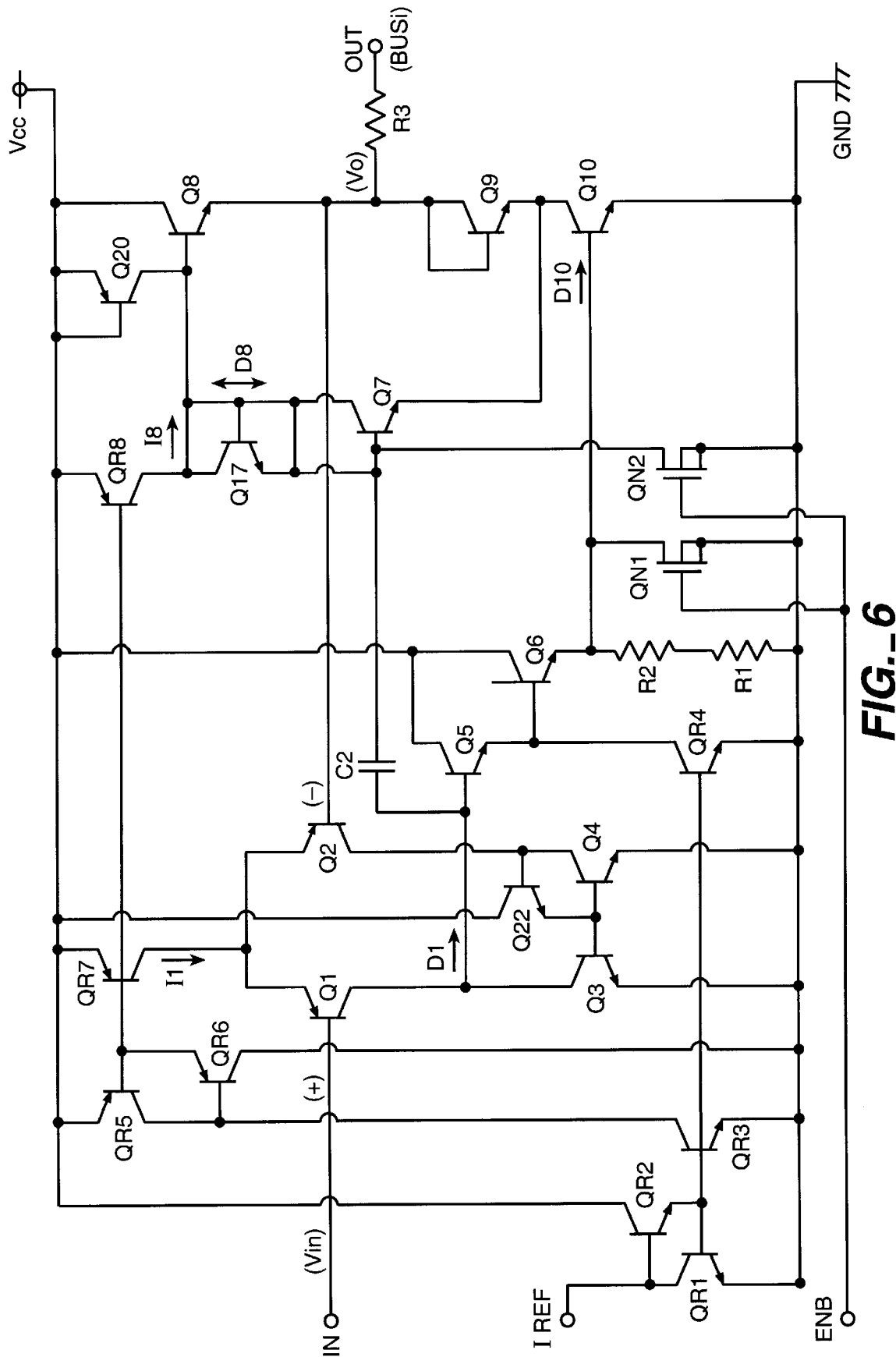
FIG._6

AMPLIFIER FOR ACTIVE TERMINATOR

BACKGROUND OF THE INVENTION

This invention relates to an amplifier for an active terminator connected to an end of a bus line such as SCSI. More particularly, this invention relates to such an amplifier for making high-speed operations of bus lines possible.

It has been known to connect terminal resistors; individually to a bus line for transmitting signals among a plurality of drive units so as, for example, to prevent "ringing." It has also been known to set the resistance of each such terminal resistor so as to match the characteristic impedance of the corresponding line and to output a specified voltage through a terminal resistor to each line. Japanese Patent Publication Tokkai 7-261890 disclosed a system using such an active terminator characterized, as shown in FIG. 5, as having amplifiers each provided to a line of a bus for outputting a specified voltage to the bus through terminal resistors such that the individual lines of the bus are dependably isolated and a high-speed operation of the bus is possible. Explained more in detail, an active terminator 4 is connected at an end of a bus 1 (having a plural n-number of lines BUS1, BUS2, . . . BUSn) to which are connected a plurality of drive units 2, 3, . . . , and the active terminator 4 is provided with n-number of amplifiers 41, 42, . . . 4n each corresponding to a different one of the bus lines BUS1, . . . BUSn, and each adapted to receive a standard voltage $V_{in}$ from a band gap voltage source (BG) 5 through an input terminal IN and connected through an output terminal OUT to the corresponding one of the bus lines BUS1, . . . BUSn. Each of these active terminator amplifiers 41, 42, . . . 4N comprises a voltage-follower type amplifier receiving the standard voltage $V_{in}$ from the input terminal IN as its non-inversion input and outputting a voltage $V_O$ to the output terminal OUT through a resistor R3.

Since a feedback line is provided to each amplifier so as to maintain the voltage $V_O$ in a matching condition with a specified voltage corresponding to $V_{in}$, the output currents from the amplifier vary according to any change in the bus lines BUS1, . . . BUSn due to the operations of the drive units 2, 3, . . . such that appropriate currents corresponding to the differences between the bus line voltage and the specified voltages are supplied by the active terminator amplifiers 41, 42, . . . 4n and hence that the occurrence of unwanted ringing can be prevented.

Such active terminator amplifiers may comprise an ordinary buffer amplifier such as having input transistors to form a differential amplifier circuit and output transistors to be driven by its differential signals, together being assembled like a totem pole. In order to eliminate any interference with other active terminators, however, Japanese Patent Publication Tokkai 7-240642 disclosed an amplifier adapted to selectively output a specified voltage through a terminal resistor in response to an enable signal.

As shown in FIG. 6, such an active terminator amplifier may comprise a pair of input transistors Q1 and Q2 serving as an input differential amplifier circuit and totem pole-shaped output transistors Q8 and Q10. As output transistor Q8 (on the current outlet side) receives a constant current I8 on its base, an idle current is caused to flow through output transistors Q8 and Q10. As one of the input transistors (Q1) receives an input voltage $V_{in}$ on its base and the other input transistor Q2 receives a feedback voltage $V_O$ on its base, they generate together a differential signal D1 and, as the output transistor Q10 is driven by a current-amplified differential signal D10, the collector current of the output transistor Q10 changes to a different current from the idle current according to the difference between the voltages $V_{in}$ and $V_O$, the difference current which is caused thereby being supplied to any of the bus lines (indicated as BUSi in FIG. 6) through a terminal resistor R3.

Enable signals are adapted to be received through terminal ENB by the gates of transistors QN1 and QN2. When the enable signal is "High," both transistors QN1 and QN2 are switched on, grounding both the line for the differential signal D10 and that for the constant current I8 and thereby leaving the output in a floating condition with high impedance. Thus, they can serve as a buffer amplifier only when the enable signal is "Low."

With active terminator amplifier thus structured being connected to an end of a bus, although it may have a plurality of active terminators connected, the output voltage $V_O$ through the terminal resistor R3 stays more or less at a specified level as shown in FIG. 7, independent of the variations in voltage on the bus line if enable signals are applied such that only selected ones of them are activated, even when the voltage on a bus line BUSi (I being a dummy index 1–n) changes between High and Low as shown in FIG. 7, say, due to the operation of the drive units. FIG. 8 shows another example of change in waveform.

With the increase in the operating speed of multi-purpose CPUs, for example, there is also an increased demand for high-speed operations of bus lines, and particularly device buses such as SCSI serving to connect peripheral apparatus.

If the speed of voltage switching is simply increased on a bus line, however, the amplifier cannot catch up with sudden changes in the voltage in the bus and phenomena such as the ringing which occur at the end of the transition section of the signal waveform cannot be controlled sufficiently. As a result, disturbances in the waveform become significantly large and it is difficult to maintain the reliability of bus operations. Thus, the operational speed of active terminator amplifiers must be increased for high-speed bus operations. As a direct method for increasing the operating speed of an amplifier, one may think of improving the speed of transistors which form the amplifier. Such a direct method is not practical, however, because the production cost will become unreasonably high. Especially in the case of an amplifier of a voltage follower type used where an output is directly fed back as an input, all of a series of transistors from the input side to the output side must be modified for a higher speed. It should also be kept in mind in this connection that if the operating speed of an element is increased, it tends to become weak against noise.

SUMMARY OF THE INVENTION

It is therefore an object of this invention to provide an amplifier for an active terminator capable of a high-speed operation.

It is another object of this invention to provide such an amplifier making use of the characteristics of the bus terminator itself.

The present invention is based on the observation that under the conditions where active terminator amplifiers are used, the input signal basically does not undergo changes and changes are caused only on the output signals due to external causes, and is characterized as using generally a method for increasing the speed of operation, which used to be considered to adversely affect the response characteristic to the input.

In what follows, four such methods will be outlines.

According to a first method, an active terminator-amplifier for outputting a specified voltage to a bus line such as SCSI through a terminal resistor is characterized as having a capacitance element (herein generally referred to as a capacitor) inserted between the drive line of an output transistor and a specified fixed voltage source. If there is a change in the signal transmitted on the bus line and its voltage condition changes, the voltage across the terminal resistor also changes suddenly, causing the output voltage of the amplifier also to change. This change is then communicated through its output transistor to the drive line of the output transistor. If there is even a small change in the voltage of this drive line, a portion of the current driving the transistor is temporarily passed from the capacitor in response to this change such that this current is immediately passed from the output transistor to the terminal resistor, preventing any sudden change in the output voltage from the amplifier. By the time the supply of current from the capacitor comes to an end, a sufficient driving current will be supplied to the output transistor through the regular signal route of the amplifier. If there is a change in the input signal to the amplifier, the existence of the capacitor causes a delay in the response of the output transistor but this is not a problem from the practical point of view because an amplifier for an active terminator is basically adapted to use an input signal of a standard voltage for its purpose of providing an output with a constant voltage. In summary, the speed of signal transmission through a bus can be increased without effecting any major design change but merely by adding a capacitor.

According to a second method, an active terminator amplifier of a voltage follower type for outputting a specified voltage through a terminal resistor is characterized wherein its output transistor is a bipolar transistor and there is a capacitor with one terminal connected to the base line of the output transistor and the other terminal connected to a source of a constant voltage. If the voltage across the terminal resistor changes suddenly due to a signal being transmitted through the bus and the output voltage of the amplifier is affected, this change is transmitted through the output transistor to reach its base. If the base voltage changes even slightly, a portion of the base current is temporarily supplied from the capacitor corresponding to this change. This current is immediately passed from the output transistor to the terminal resistor such that a sudden change of the output voltage from the amplifier is prevented. This direct supply of base current by the capacitor can be carried out much more quickly than a signal would have to go around a feedback loop of an amplifier of a voltage follower type. By the time the supply of base current from the capacitor comes to an end, a sufficient base current will have been supplied to the output transistor through the regular signal route of the amplifier along the feedback loop.

If there is a change in the input signal to the amplifier, the existence of the capacitor causes a delay in the response of the output transistor, as explained above with reference to the first method, but this presents no practical problem for the same reason.

According to a third method, an active terminator amplifier according to the second method is further characterized wherein the output transistor comprises a pair of totem pole-shaped transistors one of which (first) is driven by a constant current and the other (second) of which is driven steadily by a differential signal from an input differential amplifier circuit, the capacitor being connected to the former (first) of the pair.

Thus, an idle current sufficient for driving the bus line is constantly supplied by the first of the pair of transistors, and the second transistor of the pair serves to control the portion of the idle current to be supplied to the bus line. As a result, although the base current of the second transistor of the pair may vary frequently, that of the first transistor of the pair remains relatively stable.

Because the capacitor for temporarily supplying a current is connected to the first transistor through its base line, the capacitor is normally also in a stable condition. Thus, the supply of current can be carried out accurately only when there is a sudden change in the voltage of the bus line. As a result, the operating condition of the amplifier becomes more stable than if the capacitor is connected to the second transistor of the pair and the problem of delay in transmission of differential signals can be avoided.

According to the fourth method, an active terminator amplifier as described above is further characterized wherein the source for constant voltage, to which the capacitor is connected, comprises a source line or a grounding line. An amplifier is normally provided with a positive or negative voltage source line and a grounding line. If any of these which is laid out most conveniently for connection is used as the source for connecting the capacitor, this makes the circuit design easier.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a circuit diagram of an active terminator amplifier according to a first embodiment of this invention;

FIG. 2 is a circuit diagram of another active terminator amplifier according to a second embodiment of this invention;

FIG. 3 is a portion of the circuit diagrams shown in FIGS. 1 an 2;

FIG. 4 is an example of output waveform;

FIG. 5 is a block diagram of a prior art active terminator;

FIG. 6 is a circuit diagram of the active terminator of FIG. 5;

FIG. 7 is an example of waveforms of output voltages from the active terminator of FIG. 6; and FIG. 8 is another example of waveforms of output voltages from the active terminator of FIG. 6.

DETAILED DESCRIPTION OF THE INVENTION

The invention is described next by way of examples and with reference to FIGS. 1–4.

An amplifier for an active terminator according to a first embodiment of this invention, as shown in FIG. 1, is different from the amplifier shown in FIG. 6 in that a capacitor C3 (capacitance element) is additionally provided and connected between the base line (or drive line) of the output transistor Q8 and the grounding line GND (serving as a source of constant voltage). The output transistor Q8 is for applying a specified voltage $V_0$ to the terminal resistor R3 of the bus line.

Explained more in detail, a pair of input transistors Q1 and Q2 forms an input differential amplifier circuit and two output transistors Q8 and Q10 are connected in series in the style of a totem pole on the final downstream side. The added capacitor C3 is of a relatively small capacitance with small lead inductance, and has one end connected to the base line of the output transistor Q8 and the other end connected to the grounding line GND for temporarily delivering the supplying current D3.

The input transistors Q1 and Q2 are pnp-type transistors with matching characteristics and are driven by currents of the same intensity, their emitters being connected in common to receive a constant current I1 and their collectors being connected to a current mirror comprised of transistors Q3, Q4 and Q22. The input transistor Q1 is connected such that its base receives the standard voltage $V_{in}$ through the input terminal IN, and the input transistor Q2 is connected such that its base receives the feedback voltage $V_O$. Thus, the amplifier takes the form of a voltage follower type such that the differential signal D1 taken out from the collector line of the input transistor Q1 has a current value corresponding to the difference between the voltages $V_O$ and $V_{in}$ through such an input differential amplifier circuit.

A first current mirror comprising transistors QR1, QR2 and QR3 and a second current mirror comprising transistors QR5, QR6 and QR7 are provided for generating the constant current I1. As a very weak constant current is supplied as a standard to an input terminal IREF, this is inverted and amplified by the first current mirror and then further inverted by the second current mirror such that the constant current I1 with intensity and direction appropriate for the input differential amplifier circuit can be outputted.

There is a third current mirror formed with transistors QR5, QR6 and QR8 which is common on the input side with the second current mirror for outputting from the collector of the transistor QR8 a constant current I8 which has been amplified to a certain extent. There is also a fourth current mirror formed with transistors QR1, QR2 and QR4 which is common on the input side with the first current mirror such that the transistors Q5 and Q6 can be set in active condition.

The transistors Q5 and Q6 are npn type transistors and their collectors are both connected to the source voltage line $V_{CC}$. The emitter of transistor Q5 and the base of transistor Q6 are connected to the output line of the fourth current mirror (QR1, QR2 and QR4), and the collector of transistor Q6 is grounded through resistors R1 and R2 and also connected to the base of the output transistor Q10. When the differential signal D1 is received by the base of the transistor Q5, this is current-amplified to a certain extent and a differential signal D10 is generated inclusive of a bias component required for keeping the output transistor Q10 in active condition and is transmitted to the output transistor Q10.

The output transistor Q10 is an npn-type transistor with sufficient current-driving capability in view of the standard of the bus line, its emitter being grounded and its collector being connected through a diode-connected transistor Q9 to the line of output voltage $V_O$, that is, to the line reaching the terminal resistor R3. When it is operated with a required voltage supplied between its base and emitter by the resistors R1 and R2 and the differential signal D10 received on its base, a collector current corresponding to the differential signal D10 is passed to the grounding side while a current corresponding to the difference between the voltages $V_{in}$ and $V_O$ is received from the line of the voltage $V_O$.

The output transistor Q8 is also an npn-type transistor with sufficient current-driving capability in view of the standard of the bus line, its collector being connected to the line of source voltage $V_{CC}$ and its emitter being connected to the line of output voltage $V_O$, that is, the line reaching the terminal resistor R3. When it is operated with the constant current I8 received by its base, an approximately constant idle current is passed from the side of the power source to be discharged to the line of output voltage $V_O$.

Transistors Q7 and Q17 of pnp-type are provided between the base line of the output transistor Q8 and the collector line of the output transistor Q10. The collector, base and emitter of the transistor Q17 and the collector and base of the transistor Q7 are connected to the base line of the output transistor Q8, and the emitter of the transistor Q7 is connected to the collector line of the output transistor Q10. There is also provided a capacitor C2 with one end connected to the line of differential signal D1 and the other end connected to the base of the transistor Q7.

Consider now the voltage difference between the base line of the output transistor Q8 and the collector line of the output transistor Q10. Under a steady state condition, since the route through the transistors Q8 and Q9 balances with the route through the transistors Q17 and Q7, the presence of the transistors Q17 and Q7 and the capacitor C2 does not affect the operation of the amplifier. Under the transitory condition, however, a portion of the constant current I8, that is, the portion D8 of the base current of the output transistor Q8 is bypassed through the transistors Q17 and Q7 to the side of the output transistor Q10, corresponding to the changes in the differential signal D1. This is how the amplifier operations are stabilized under a transitory condition. In order not to have this effect adversely affected, the capacitance of the capacitor C3 is set smaller than that of the capacitor C2. As a typical example, the capacitance of the capacitors C2 and C3 may be 25 pF and 10 pF, respectively.

Two MOS transistors QN1 and QN2 are also provided, adapted to receive the enable signal inputted through terminal ENB through their gates. Even with the capacitor C3 introduced, when the enable signal is "High," both MOS transistors QN1 and QN2 are switched on such that the lines of differential signal D10 and the constant current I8 are grounded and the output is put in a floating condition with high impedance. Thus, the amplifier functions as a buffer amplifier only if the enable signal is "Low," and this invention is applicable also to an active terminator adapted to selectively output a specified voltage through a terminal resistor corresponding to the enable signal.

FIG. 2 shows another amplifier for an active terminator according to a second embodiment of this invention which is the same as the amplifier according to the first embodiment of the invention described above except only that the other end of the additional capacitor C3 is not grounded but is connected to the source voltage $V_{CC}$.

Next, the manners of using the amplifier according to this invention will be described with reference to FIGS. 3 and 4.

Before the system is used, one end of the terminal resistor R3, from the other end of which the output voltage $V_O$ is received, is connected to a bus line BUSi (I being a dummy index 1–n), an input voltage $V_{in}$ is applied to the input terminal IN, a constant current is passed to the reference input terminal IREF and the enable signal inputted through the terminal ENB is set to "Low." This sets the amplifier in an operable condition.

Next, an idle current is passed to the line at voltage $V_O$ from the output transistor Q8 driven by the constant current I8. If the bus line BUSi is in the "High" voltage condition, the voltage $V_O$ is raised slightly by the bus line BUSi through the terminal resistor R3 and is fed back to the base of the input terminal Q2. The current of the differential signal D1 from the input terminal Q1, and hence that of the differential signal D10, is increased, and the idle current is almost completely discharged from the line at voltage $V_O$ to the ground GND by the output transistor Q10 driven by the differential signal D10. The current, which flows into the terminal resistor R3 corresponding to the difference between the voltages of the bus line BUSi and $V_0$, is also discharged by the output transistor Q10 to the ground GND from the line at voltage $V_0$.

If the voltage condition of the bus line BUSi is suddenly changed from "High" to "Low" by the operation of any of the drive units while the condition of the circuit is thus balanced, the current which has been flowing from the bus line BUSi through the terminal resistor R3 drops, affecting the line at voltage $V_0$ and causing the voltage $V_0$ to become slightly lower. This drop is not only fed back to the base of the input transistor Q2 but also communicated to the output transistor Q8, causing a slight change in the base voltage of the output transistor Q8. While the effects of the feedback to the input transistor Q2 are reaching the input transistor Q1 and the differential signal D1, a supply current D3 from the capacitor C3 reaches the baseline of the output transistor Q8, immediately increasing the current discharged from the output transistor Q8 and thereby making up, to a certain extent, for the decrease in the current flow through the terminal resistor R3.

This supply current D3 is only for a limited time duration. It stops quickly and the current discharged from the output transistor Q8 returns also quickly to the original level of the idle current. In the meantime, the current for the differential signal D10 decreases. Accordingly, the current which is passed from the line at voltage $V_0$ to the ground GND by the output transistor Q10 is also limited. The difference between the discharge current from the output transistor Q8 and the incoming current into output transistor Q10 is thus supplied through the terminal resistor R3 from the output line at voltage $V_0$ to the bus line BUSi. When the voltage $V_0$ eventually becomes comparable to $V_{in}$ due to the voltage generated across the terminal resistor R3 by this difference current, the circuit returns to the balanced condition.

If the voltage condition of the bus line BUSi is changed under this condition from "Low" to "High," the process is as described above although the directions of changes in currents and voltages are reversed. Thus, the discharge current from the output transistor Q8 is temporarily reduced first by a supply current D3, and the current intake by the output transistor Q10 is increased next by the differential signal D10 based on a feedback, the balanced condition being thereby maintained.

In summary, whether the voltage condition of the bus line BUSi changes to "High" or "Low," the supply current D3 is quickly supplied from the capacitor C3 to the base of the output transistor Q3 such that, even if there is a very sudden change in the voltage on the side of a bus line, the voltage $V_0$ can come quickly to rest at a desired level as shown in FIG. 4 by sold lines. This is to be compared with the result (shown in FIG. 4 by dotted lines) which would be obtained by a prior art technology. The ringing of the bus line BUSi can accordingly be reduced.

In summary, the present invention makes it possible to easily provide an amplifier with an improved operating speed for an active terminator merely by adding a capacitor for temporarily supplying a current to the base of an output transistor until the feedback mechanism of the amplifier itself begins to be effective.

What is claimed is:

1. An active terminator amplifier for outputting a specified voltage through a terminal resistor to a bus line, said amplifier comprising:

an output transistor on output side of said amplifier;

a feedback line for feeding back said specified voltage from a connecting line between said output transistor and said terminal resistor to input side of said amplifier;

driver line for driving said output transistor;

a source for constant voltage; and a capacitor inserted between said driver line and said source.

2. The amplifier of claim 1 wherein said source is a source power voltage line.

3. The amplifier of claim 1 wherein said source is a grounding line.

4. The active terminator amplifier of claim 1 wherein said capacitor is connected directly to said driver line.

5. A voltage follower amplifier for an active terminator for outputting a specified voltage through a terminal resistor to a bus line, said amplifier comprising:

a bipolar transistor on output side of said amplifier, said bipolar transistor having a base line connected thereto;

a feedback line for feeding back said specified voltage from a connecting line between said bipolar transistor and said terminal resistor to input side of said amplifier;

a source for constant voltage; and a capacitor with one end connected to said base line and the other end connected to said source.

6. The amplifier of claim 5 wherein said bipolar transistor includes a pair of totem pole transistors, one of the transistors of said pair is driven by a constant current, the other transistor of said pair being driven steadily by a differential signal, said one end of said capacitor being connected to either one of said pair of transistors.

7. The amplifier of claim 6 further comprising a differential amplifier circuit on input side, said differential signal being outputted from said differential amplifier circuit.

8. The amplifier of claim 6 wherein said source is a source power voltage line.

9. The amplifier of claim 6 wherein said source is a grounding line.

10. The amplifier of claim 7 wherein said source is a source power voltage line.

11. The amplifier of claim 8 wherein said source is a grounding line.

12. The voltage follower amplifier of claim 5 wherein said capacitor is connected directly to said base line.

* * * * *